(12) United States Patent
Seong

(10) Patent No.: US 7,069,923 B2
(45) Date of Patent: Jul. 4, 2006

(54) APPARATUS AND METHOD OF CONTROLLING FAN MOTOR IN DOWNDRAFT GAS RANGE

(75) Inventor: Yeon-Soo Seong, Ansan-si (KR)

(73) Assignee: Paseco Co., Ltd. (KR)

( * ) Notice: Subject to any disclaimer, the term of this patent is extended or adjusted under 35 U.S.C. 154(b) by 0 days.

(21) Appl. No.: 10/975,954

(22) Filed: Oct. 28, 2004

(65) Prior Publication Data

US 2005/0088128 A1 Apr. 28, 2005

(30) Foreign Application Priority Data

Oct. 28, 2003 (KR) .................. 10-2003-0075667

(51) Int. Cl.
  *F24C 3/00* (2006.01)
  *F24C 15/20* (2006.01)
  *H02P 7/00* (2006.01)
(52) U.S. Cl. ............... 126/39 R; 126/39 E; 126/37 R; 126/300; 126/301; 318/591; 318/471; 318/53
(58) Field of Classification Search .................. None
  See application file for complete search history.

(56) References Cited

U.S. PATENT DOCUMENTS

| 4,736,729 A | * | 4/1988 | Beach .................. 126/39 R |
| 4,750,470 A | * | 6/1988 | Beach et al. ............ 126/39 R |
| 5,000,157 A | * | 3/1991 | Harper et al. ........... 126/41 R |
| 5,001,970 A | * | 3/1991 | Graver .................. 99/339 |
| 5,287,799 A | * | 2/1994 | Pickering et al. ......... 99/446 |
| 5,325,842 A | * | 7/1994 | Beach et al. ............ 126/39 R |
| 5,884,619 A | * | 3/1999 | Terry .................. 126/299 D |
| 6,293,276 B1 | * | 9/2001 | Owens et al. ........... 126/299 D |
| 6,807,962 B1 | * | 10/2004 | Taplan et al. ........... 126/39 B |

\* cited by examiner

*Primary Examiner*—Marlon T. Fletcher
*Assistant Examiner*—Eduardo Colon Santana
(74) *Attorney, Agent, or Firm*—Cantor Colburn LLP

(57) ABSTRACT

Disclosed are an apparatus and method of automatically operating a fan motor when a grill is used in a downdraft gas range and, more particularly, an apparatus and method of enabling a user to arbitrarily adjust the wind during automatic fan motor operation. The present invention is configured to be able to adjust the speed of the fan motor by variously operating the state of the fan switch during the use of the grill. The downdraft gas range is capable of controlling the speed of the fan motor during the automatic operation by automatically operating the fan motor even when the fan switch is open during the use of the grill and enabling the user to select the speed of the fan motor during the use of the grill.

3 Claims, 4 Drawing Sheets

APPARATUS AND METHOD OF CONTROLLING FAN MOTOR IN DOWNDRAFT GAS RANGE

CROSS-REFERENCE TO RELATED APPLICATION

This application claims the benefit of Korean Patent Application No. 2003-75667, filed Oct. 28, 2003, the disclosure of which is hereby incorporated herein by reference in its entirety.

BACKGROUND OF THE INVENTION

1. Field of the Invention

The present invention relates to an apparatus and method of controlling a fan motor in a downdraft gas range and, more particularly, to an apparatus and method of controlling a fan motor in a downdraft gas range capable of automatically operating a ventilation system when a grill is used and allowing an user to arbitrarily adjust the wind during the automatic operation.

2. Description of the Related Art

Generally, a gas range includes a grill and a burner, which are mutually controlled. Meanwhile, when the grill is used, it becomes important to treat smoke or grease generated as a result of cooking. In order to solve the problem, a type capable of inhaling the smoke and grease generated using the grill in a downward direction of the gas range and discharging the smoke and grease to the exterior by providing a ventilation device communicated with the exterior in the gas range has been introduced, which is referred to as a downdraft type.

At this time, the ventilation device is configured to inhale and discharge the smoke or grease according to the operation of a fan driven by a fan motor. Meanwhile, the fan includes a plurality of speed selection switches capable of adjusting the operation speed of the fan to allow a user to adjust the speed when the fan is driven.

Meanwhile, in a conventional gas range, though a user forgets to operate a fan motor switch when the user uses the grill, the fan motor recognizes a grill mode to be automatically operated. However, the conventional gas range is configured to be operated in the state that the speed of the fan motor is fixed to an appropriate speed for discharging the grease, generally the maximum speed, when the fan motor is automatically operated according to the use of the grill. Therefore, when the fan motor is automatically operated, it becomes impossible to adjust the speed, and also, it may become difficult to discharge the grease from the ventilation device due to grease accumulated in repeated grease discharging processes.

SUMMARY OF THE INVENTION

In order to solve the foregoing and/or other problems, it is an aspect of the present invention to provide an apparatus and method of controlling a fan motor for a downdraft gas range capable of allowing a user to arbitrarily select the speed of the fan motor, since the speed of the fan motor is not fixed even when the fan motor is automatically operated while a grill is used in the downdraft gas range.

Additional aspect and advantages of the present invention will be set forth in part in the description which follows and, in part, will be obvious from the description, or may be learned by practice of the invention.

The foregoing and/or other aspects of the present invention may be achieved by providing a downdraft gas range capable of selecting the speed of a fan motor through a fan switch speed selection terminal during automatic fan operation according to the use of a grill. The apparatus of the present invention includes a grill, a grill switch for operating the grill, a fan relay for transmitting an external power source to the fan motor, a fan switch for selecting the speed of the fan motor, and the fan motor for driving a fan.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE INVENTION

Figure 1:
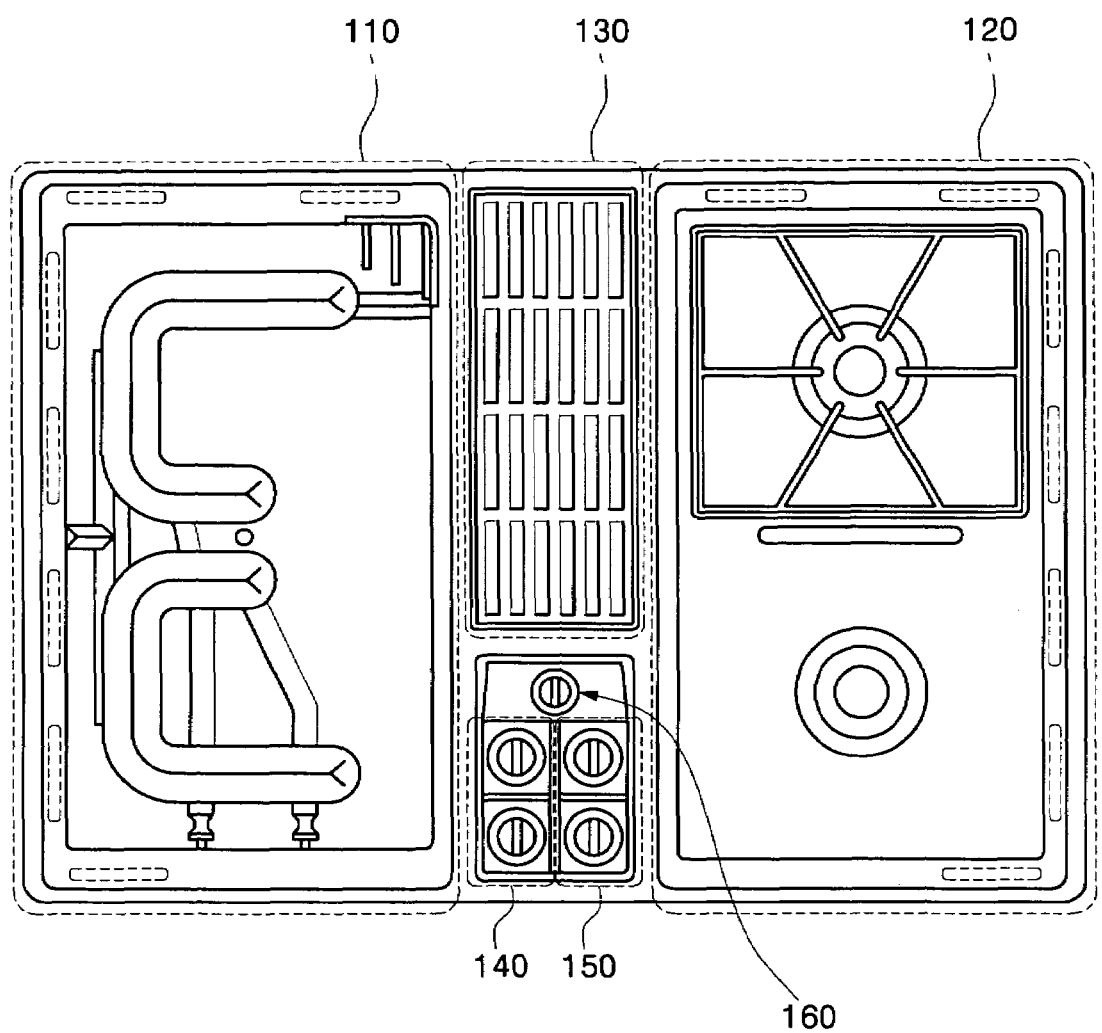
FIG. 1 illustrates a fan control switch according to the present invention applied to a conventional downdraft gas range.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Hereinafter, the present invention will be described with reference to the accompanying drawings.

FIG. 1 illustrates a fan control switch according to the present invention applied to a conventional downdraft gas range.

As described above, the downdraft gas range is provided with a ventilator 130, for inhaling smoke or grease generated when a grill 110 is used, in the gas range without separating from the gas range, thereby promptly treating them when the smoke or grease are generated. A fan existing in the gas range is configured to discharge the inhaled grease in a downward direction of the gas range. The reason for this is that it is possible to prevent a problem from generating when the ventilator 130 is separately formed on the gas range.

Meanwhile, when a burner 120 is used, it is assumed that the fan does not operate since it may be dangerous when the fan is operated. Whether the grill or the burner is used may be detected by selection of a grill switch 140 or a burner switch 150. In addition, when a user wants to use the grill, the user may select the speed of the fan through a fan switch 160 including a fan motor speed selection terminal.

At this time, as described above, when the user uses the grill with forgotten the operation of the fan switch, the conventional gas range performs the automatic fan operation regardless of user's selection, at this time, the operation speed is performed at a high speed, i.e. the maximum speed of the fan switch 160. In addition, since the fan switch 160 does not operate during the automatic operation, the user cannot control the fan speed. The present invention makes the speed selection by the fan switch 160 during the automatic operation possible, thereby enabling the user to control the fan speed.

Figure 2:
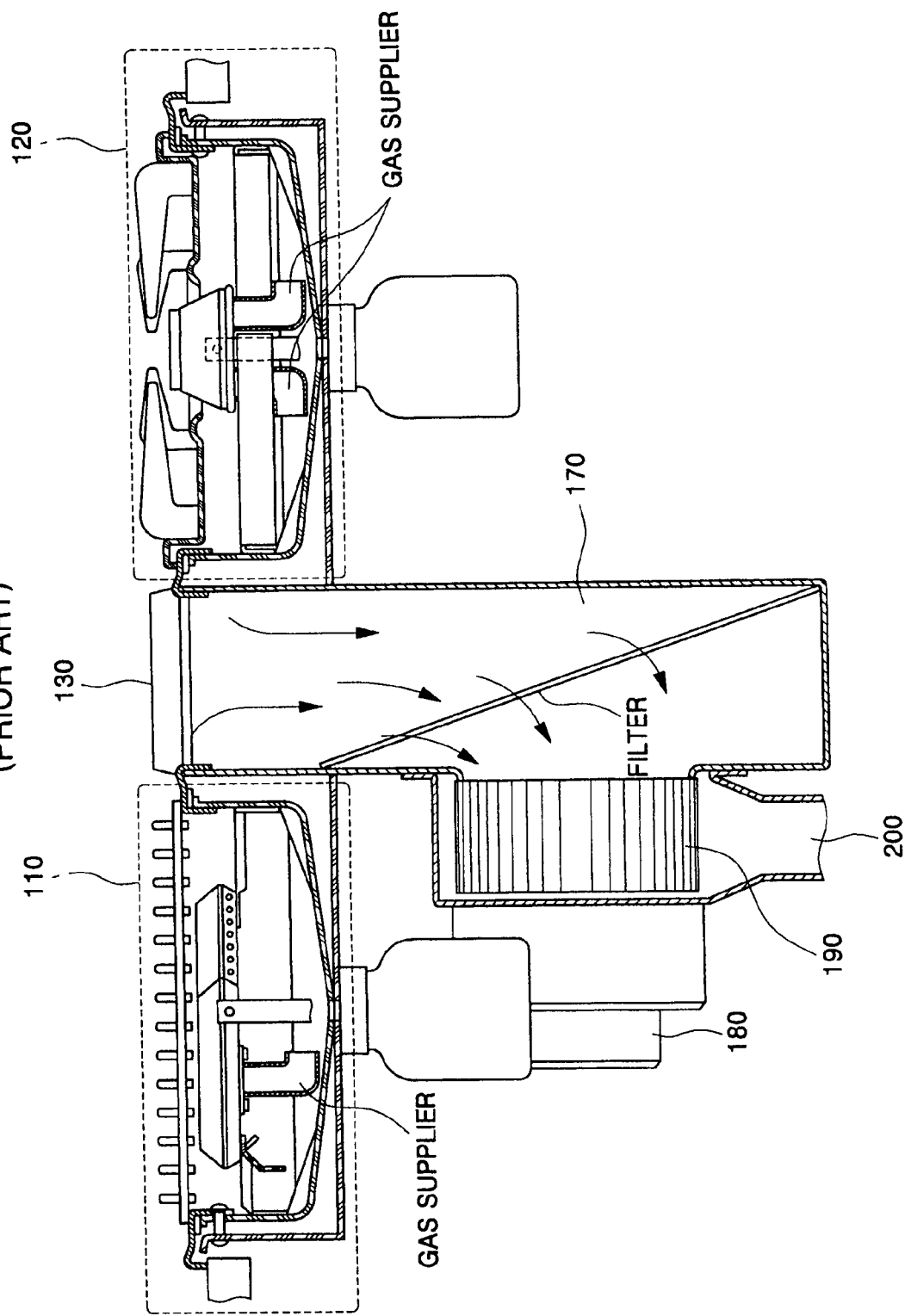
FIG. 2 is a cross-sectional view of a conventional downdraft gas range.

FIG. 2 is a cross-sectional view of a conventional downdraft gas range;

The gas range in accordance with the present invention, if necessary, may provide various methods such as a cartridge exchange and so on in order to use as a grill or a burner. That is, the gas range is used as the grill or the burner by exchanging the cartridge, and a fan 190 is operated only when the grill is used.

When the grill is used, a fan motor 180 is used in order to drive the fan 190, and the fan motor 180 is operated according to on/off of a grill switch for detecting whether the grill 110 is operated or not. The fan 190 uses the wind generated by the operation of the fan motor 180 to discharge smell or grease generated when the grill 110 is used. The ventilator 130 for discharging foreign substances due to the use of the grill 110 includes an inhalation section 170 and a discharge section 200 to inhale the smell or grease generated when the grill 110 is used in a downward direction of the gas range and then to discharge them to the exterior.

Figure 3:
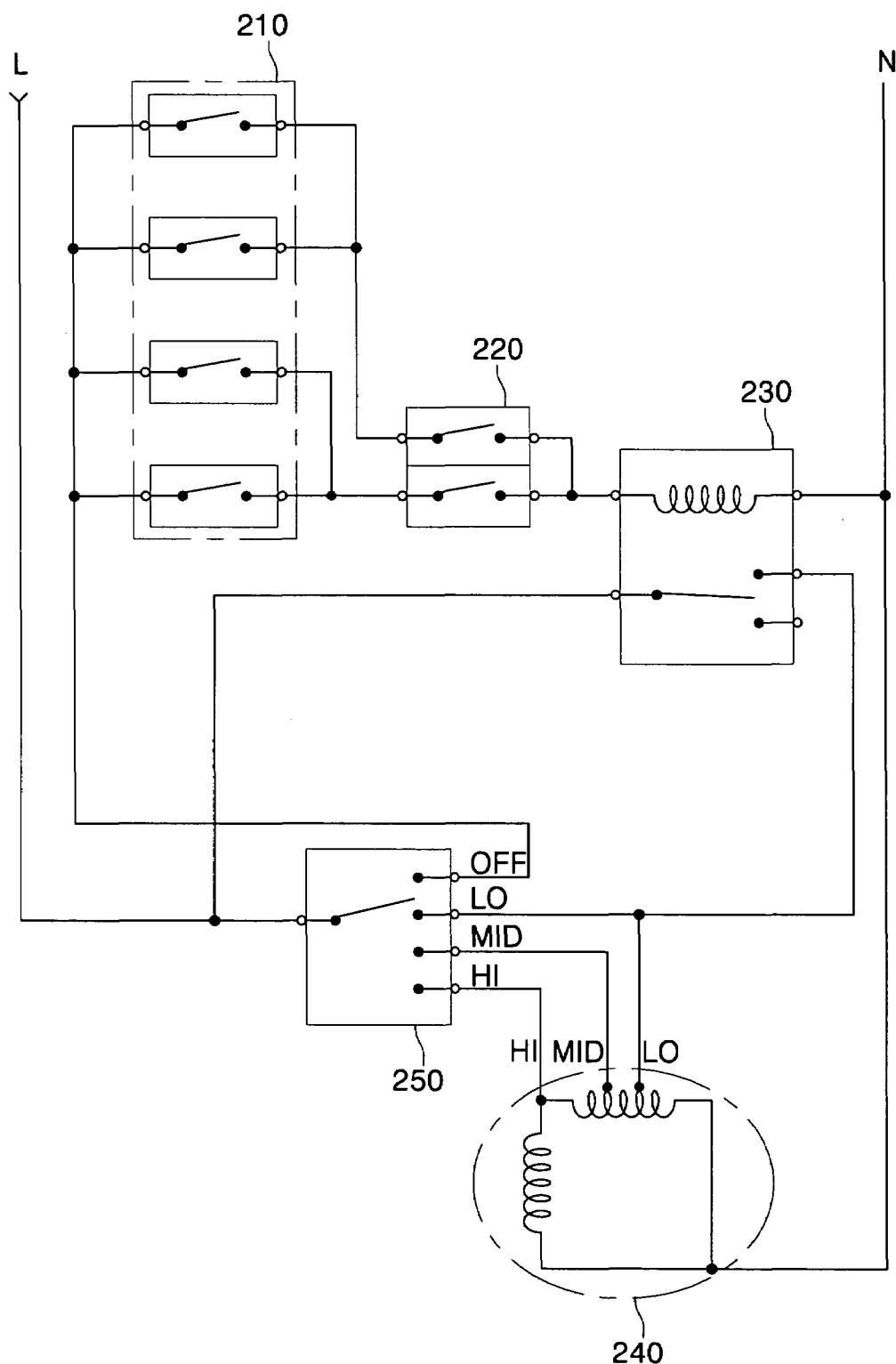
FIG. 3 is a view illustrating a fan speed control circuit of a gas range in accordance with the present invention.

FIG. 3 is a view illustrating a fan speed control circuit of a gas range in accordance with the present invention.

A fan switch 250 functions to select the speed of a fan motor 240, which has four steps i.e., OFF, LO, MID and HI. In the present invention, when the fan switch 250 is OFF, that is, when a user forgets the operation of the fan switch 250 in the case of using the grill, the fan motor 240 is automatically operated at the LO step.

Meanwhile, a valve switch 210, a grill switch 220 and a fan relay 230 are operated as an individual circuit only when the fan switch 250 is OFF, and when the fan switch 250 is not OFF, but one of LO, MID and HI, the switches 210, 220 and 230 cannot operate as the individual circuit since the external power source is not supplied.

The valve switch 210 functions to ignite the gas range, and the gas range is ignited by sparking with an individual spark module according to the operation of an ignition switch together with supplying gas according to the operation of the valve switch 210. The grill is operated as a grill valve switch turns on/off. In particular, the valve switch 210 functions to supply the external power source to the fan motor 240 when the fan switch 250 is OFF.

The grill switch 220 functions to detect whether the grill is existed in the gas range or not, which is normally closed. The grill switch 220 is normally closed when a grill cartridge is attached to the gas range, and opened when a burner cartridge is attached to the gas range. This is because it is required to prevent the fan motor 240 from operating when the burner is used.

The fan relay 230 is a device for detecting the operation of the grill. A relay means a device for controlling a large current using a small current, i.e., performing the on/off operation of an electric circuit by changing electric energy of another electric circuit.

The fan motor 240 is operated as the external power source is supplied by the fan switch 250, and the speed of the fan motor 240 is determined according to the state of the fan switch 250. However, as described above, even though the fan switch 250 is OFF, the fan motor 240 maintains a speed of the LO state.

First, the operation of the fan motor 240 when the fan switch 250 is OFF will be described. At this time, as described above, although the fan switch 250 is OFF, the fan motor 240 is connected to the external power source to be automatically operated. Therefore, when the fan switch 250 is normally maintained as the OFF state, the valve switch 210, the grill switch 220 and the fan relay 230 are operated as an individual circuit.

In addition, according to the user's selection, any one of LO, MID and Hi may be maintained.

When the fan switch is OFF, the external power source is connected to the valve switch 210. At this time, when the user uses the grill, current flows through the fan relay 230 since the grill switch is closed, at this time, the external power source is directly supplied to the fan motor 240 through the fan relay 230.

Finally, even though the fan switch 250 is OFF, the external power source may be applied to the LO terminal of the fan motor 240 through the fan relay 230. At this time, the fan motor 240 is operated in the LO state although the fan switch 250 is in the open state, therefore, the fan motor may be automatically operated even when the user forgets the operation of the fan motor 240 during the use of the grill. The speed of the fan motor 240 as the LO state is established to implement the maximum speed of the conventional technology to sufficiently provide the grease discharge effect with only the LO state.

On the other hand, when the fan switch is not OFF, but any one of LO, MID and Hi, as described above, the external power source is not supplied, therefore, the valve switch 210, the grill switch 220 and the fan relay 230 cannot perform the individual circuit function. Therefore, the fan motor 240 is supplied with the power source from the fan switch 250 directly, and the operation speed of the fan motor 240 is determined by selecting the speed of the fan switch 250.

For example, when the fan switch 250 is selected as the LO state by the user, that is, when the fan switch 250 is closed in the LO state, the current is directly applied from the external power source to the LO terminal of the fan motor 240 to make the fan motor 240 be operated in the LO state. At this time, since the operation in the LO state is performed by the user's selection, it is different from the automatic LO operation due to opening of the fan switch 250 as described above. At this time, the remaining circuits except for the fan switch 250 and the fan motor 240 are not operated as the power supply is cut and separated from the fan motor 240 as described above.

Similarly to the abovementioned method, when the fan switch 250 is closed in the MID or HI state, the current is directly introduced into the MID or HI terminal of the fan motor 240 from the external power source to operate the fan motor 240 in the MID or HI state. As described above, the present invention is capable of selecting the speed of the fan motor 240 by the user's selection regardless of the operation state of the fan motor 240 when the grill is used.

Figure 4:
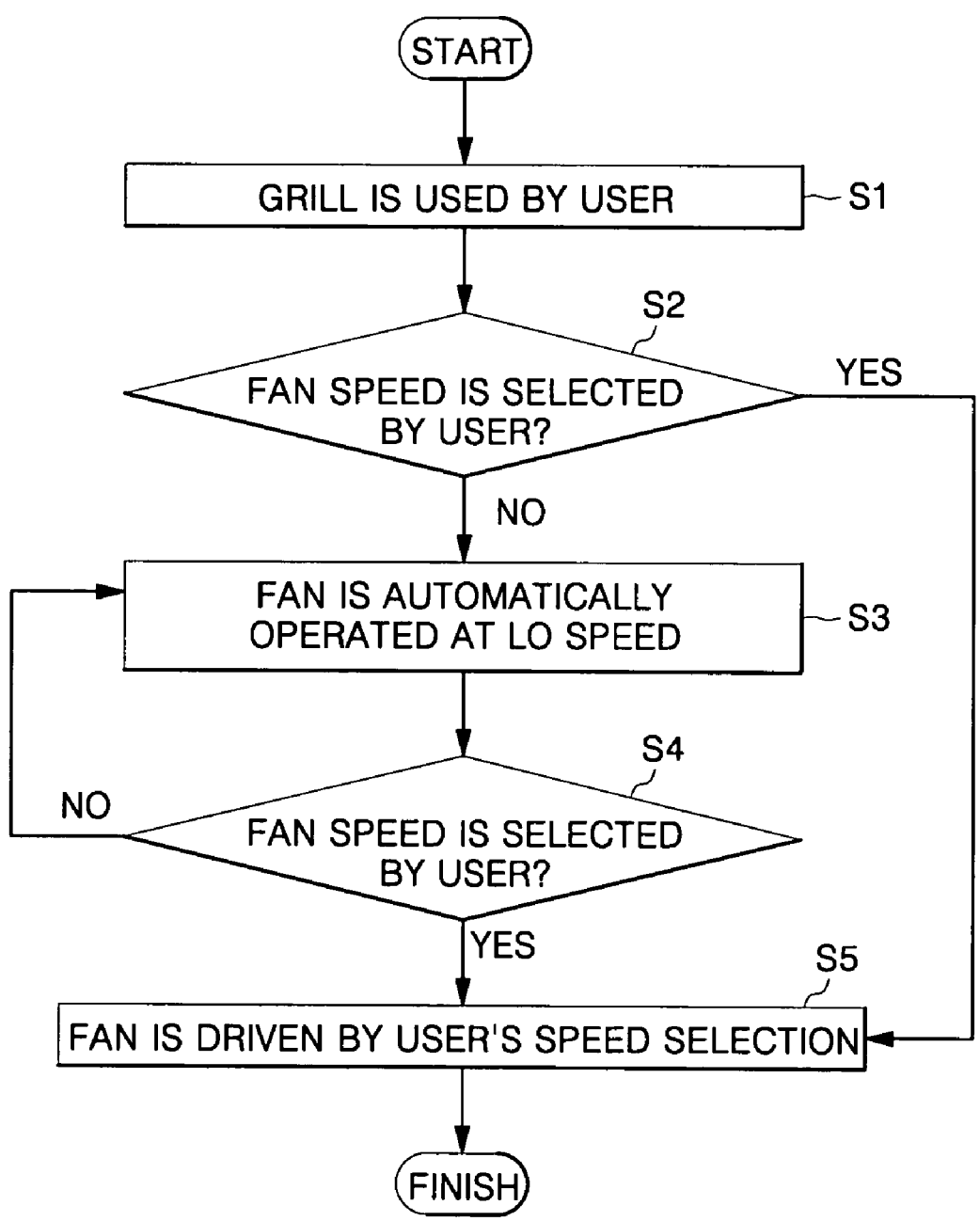
FIG. 4 is a flow chart of a method of controlling a fan motor for a gas range in accordance with the present invention.

FIG. 4 is a flow chart of a method of controlling a fan motor for a gas range in accordance with the present invention.

First, the user uses the grill to operate a ventilation system of the gas range in accordance with the present invention (S1). At this time, the use of the grill includes the case of using the grill already installed at the gas range and the case of using the grill by mounting a grill cartridge. The grill may be operated as the user manipulates a grill valve switch.

During the use of the grill, when the user handles a speed selection terminal of the fan switch to drive the fan motor (S2), the fan is driven at a speed selected by the user (S5). Meanwhile, similarly to the above mentioned, even when the user forgets the operation of the fan switch during the use of the grill, the fan is automatically driven. While the conventional gas range fixes the maximum speed of the automatic fan operation to the HI during the use of the grill, the present invention operates the fan in the LO, that is, the minimum speed (S3).

The present invention is characterized in that the user may control the fan switch even when the fan is automatically operated, and therefore, the user may determine the speed of the fan during the automatic operation of the fan (S4). It becomes a special feature of the present invention since it is different from the conventional gas range that the speed selection is impossible during the automatic fan operation according to the use of the grill.

Therefore, when the user arbitrarily selects the fan operation speed during the automatic fan operation, the fan motor is driven at a speed selected by the user (S5). On the other hand, when the user does not perform any action during the automatic fan operation, as described above, it should pay attention that the fan is fixedly operated in the LO, that is, the minimum speed (S3). As described above, the present invention is capable of controlling the fan switch even when the fan is automatically operated as the gas range is used as the grill, thereby enabling the user to select the speed of the fan during the automatic fan operation.

As can be seen from the foregoing, the downdraft gas range in accordance with the present invention is capable of controlling the speed of the fan motor during the use of the grill by automatically operating the fan motor even when the fan switch is open during the use of the grill in the gas range and enabling the user to select the speed of the fan motor even during the automatic fan motor operation.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An apparatus of controlling a fan motor for a downdraft gas range, the apparatus comprising:
    an operation switch for selectively operating either one of a grill and a burner;
    a switch for detecting whether the grill exists or not;
    a fan relay for detecting whether the grill is operated or not;
    a fan motor coupled with a fan, for detecting operation of the grill and automatically operating at a selectable constant speed;
    a fan control switch for manually adjusting the speed of the fan motor regardless of whether the fan motor is in an ON state or an OFF state;
    wherein the fan control switch comprises an OFF mode in which the fan motor receives power provided from the fan relay at the same time the fan relay detects operation of the grill to thereby operate automatically at a constant speed, and manually adjustable LO, MID, and HI modes in which the fan motor receives power provided through the fan switch to thereby operate at respective LO, MID, and HI speeds.

2. The apparatus according to claim 1, wherein automatic operation of the fan motor corresponds to the LO speed when the fan control switch is in the OFF mode.

3. A method of controlling a fan motor for a downdraft gas range, in which a fan is automatically operated by detecting operation of a grill, the method comprising:
    determining whether a fan speed to be applied during operation of the grill is selected by a user at the same time a grill valve switch is closed;
    determining which one of OFF, LO, MID, and HI modes is selected when the fan speed is selected by the user;
    automatically driving the fan motor at a speed corresponding to the LO mode when the OFF mode is selected and driving the fan motor at a speed corresponding to a selected one of the LO, MID, and HI modes when one of the LO, MID, and HI modes is selected; and
    driving the fan motor at a speed corresponding to the user's selection when the user manually selects one of the MID and HI modes while the fan motor is being automatically driven at a speed corresponding to the LO mode when in the OFF mode.

* * * * *